United States Patent [19]
Pitcher et al.

[11] 3,932,109

[45] *Jan. 13, 1976

[54] ULTRASONIC BURNER MEANS

[75] Inventors: Edwin W. Pitcher, White Bear Lake; Thomas L. Nystrom, Falcon Heights, both of Minn.

[73] Assignee: Minnesota Mining and Manufacturing Company, St. Paul, Minn.

[ * ] Notice: The portion of the term of this patent subsequent to Apr. 30, 1991, has been disclaimed.

[22] Filed: Mar. 11, 1974

[21] Appl. No.: 449,928

Related U.S. Application Data

[62] Division of Ser. No. 334,749, Feb. 22, 1973, Pat. No. 3,808,056.

[52] U.S. Cl. .......................... 431/1; 239/4; 239/102
[51] Int. Cl.² ...................... F23C 3/02; B05B 3/14
[58] Field of Search ..................... 431/1; 239/4, 102

[56] References Cited
UNITED STATES PATENTS

| | | | |
|---|---|---|---|
| 2,644,512 | 7/1953 | Durr et al. ............................. | 431/1 |
| 3,103,310 | 9/1963 | Lang ............................... | 239/102 X |
| 3,275,059 | 9/1966 | McCullough ........................ | 239/102 |
| 3,469,929 | 9/1969 | Haag ......................................... | 431/1 |
| 3,796,536 | 3/1974 | Hori et al. ......................... | 239/102 X |
| 3,808,056 | 4/1974 | Pitcher et al. ....................... | 431/1 X |

Primary Examiner—Charles J. Myhre
Assistant Examiner—William C. Anderson
Attorney, Agent, or Firm—Alexander, Sell, Steldt & DeLaHunt

[57] ABSTRACT

An improved burner assembly, especially useful to heat a thermoelectric generator, comprising an ultrasonic atomizer for atomizing liquid fossil fuels into a mist of fine particles; baffle means for causing an appropriate mixture of fuel and air; and, usually, a mantle for uniformly distributing the heat of combustion over a cylindrical hot plate against which thermoelectric legs are disposed.

8 Claims, 5 Drawing Figures

3,932,109

ULTRASONIC BURNER MEANS

This is a division of application Ser. No. 334,749 filed Feb. 22, 1973, and now Pat. No. 3,808,056.

BACKGROUND OF THE INVENTION

Interest in heating thermoelectric generators with liquid fossil fuels was enhanced several years ago when an ultrasonic atomizer capable of atomizing liquid fuels into a mist of fine particles was developed. The art had previously desired generators heated with liquid fossil fuels[1] but had been inhibited by deficiencies in traditional techniques for atomizing such fuels.[2] Ultrasonic atomizers gave promise of overcoming these deficiencies because of the low fuel pressures used in ultrasonic atomization, the very fine size of the atomized particles, and the compact size of the mist of atomized particles. Designs for thermoelectric generators using ultrasonic atomizers followed after the introduction of such atomizers; see paper CP 66-3 presented at the American Petroleum Institute Research Conference on Distillate Fuel Combustion for 1966 (API Publication No. 1705)(for suggestions of other burner assemblies generally intended for uses other than in thermoelectric generators see other papers in the series CP 66-1 through CP 66-6 of that publication, API publications for other years, and U.S. Pat. No. 3,275,059).

1. For one reason, gaseous fuels such as propane, which are today generally used to heat commerical thermoelectric generators, require large, heavy, pressurized storage tanks. These tanks add expense to installation and operation of thermoelectric generators, and they conflict with the advantages of portability and small size offered by thermoelectric generators. Also, if the variety of liquid fossil fuels that are commercially available could be used to heat a thermoelectric generator, a flexibility in fuel selection would result that is desirable for many installations of thermoelectric generators.
2. Some of the deficiencies in the traditional technique of forcing liquid fuel under pressure through a nozzle include: (a) the pressure-atomized spray of fuel is too large for the small combustion chambers desired in compact thermoelectric generators; (b) the pressure-atomized fuel particles are relatively large and require large supplies of air for combustion, meaning that unduly high percentages of the output of the generator are required to drive an air blower; (c) the small-diameter nozzle orifice necessary for low rates of fuel flow such as used in a thermoelectric generator is susceptible to clogging; and (d) the technique permits only limited adjustment of the amount of electricity generated or the variety of fuel used.

However, despite the prior suggestions for thermoelectric generators incorporating burner systems based on ultrasonic atomizers, and despite significant efforts based on those suggestions, no successful thermoelectric generator of this type has ever been produced until the present invention. None of the previous suggestions was able to satisfy the rather severe requirements for a burner system in a thermoelectric generator. A primary requirement leading to other requirements is that the burner system must be compact to make the generator compact. Yet the system must operate at a peak efficiency so as to maximize the efficiency of the generator. Further, the system must be capable of long, unattended operation, and the burning must be stable so as to provide a stable supply of heat distributed uniformly over the hot ends of the thermoelectric legs in the generator.

We have found that a prinicpal reason for the failure of the previous designs lies in the scheme provided in those designs for controlling the movement of fuel and air through the burner system. The prior suggestions have not provided a mixing of fuel and air that was rapid, thorough, and uniform enough; the mixture of fuel and air was not compact enough; and too large volumes of air were required. The failure of the burner systems previously suggested for thermoelectric generators—they have generally been incapable of long, stable, and trouble-free operation, and they have been inefficient in use of fuel and in use of generated electricity to power movement of air—may be traced directly to failure to properly control the movement of fuel and air through the burner system. Proper control of that movement of fuel and air is critical to providing long-lasting, efficient burner systems based on ultrasonic atomizers for use in thermoelectric generators.

SUMMARY OF THE INVENTION

The present invention provides a new burner assembly that, as a result of its control of atomized liquid fossil fuel and oxidizing gas moving through the assembly, is useful in a thermoelectric generator to achieve high efficiency and reliable operation. Briefly, a burner assembly of the invention, which is especially useful in those thermoelectric generators that include a cylindrical hot plate against which the hot-junction ends of thermoelectric legs are disposed, comprises, in alignment with said cylindrical hot plate on a central axis, (A) blower means spaced on said axis from said hot plate and arranged to blow an oxidizing gas along said axis toward the hot plate; (B) an ultrasonic atomizer between the blower means and hot plate, connected to a source of liquid fuel, and having a vibrating horn located on said axis from which the fuel emanates downstream as a fine mist; (C) a cylindrical wall spaced radially around said horn and connected to said blower means so as to convey said oxidizing gas downstream from said blower means past said horn; and (D) baffle means disposed around said horn and consisting essentially of a set of overlapping vanes that are attached to the inside of said wall, extend radially toward said axis, and are disposed at an angle to said axis so as to direct a first part of the oxidizing gas conveyed downstream by the cylindrical wall into a vortex; the innermost edge of the vanes being adjacent to, but spaced from, said horn so as to define an area through which a second part of said oxidizing gas passes unimpeded; and the outermost edge of at least part of the vanes being spaced from the cylindrical wall so as to permit a third part of said oxidizing gas to pass unimpeded along the wall so as to contain said vortex into a compact area, whereby the flame of fuel supplied by said ultrasonic atomizer is kept compact.

A cylindrical burner housing is generally aligned on said axis and extends from said cylindrical wall; and a cylindrical, closed-end mantle is aligned on said axis, connected to said burner housing, and juxtaposed within said cylindrical hot plate. This mantle preferably comprises a solid cylindrical wall perforated by a set of holes distributed over the mantle so as to provide a uniform distribution of heat over the cylindrical hot plate.

DETAILED DESCRIPTION OF THE DRAWINGS

DETAILED DESCRIPTION

Figure 1:
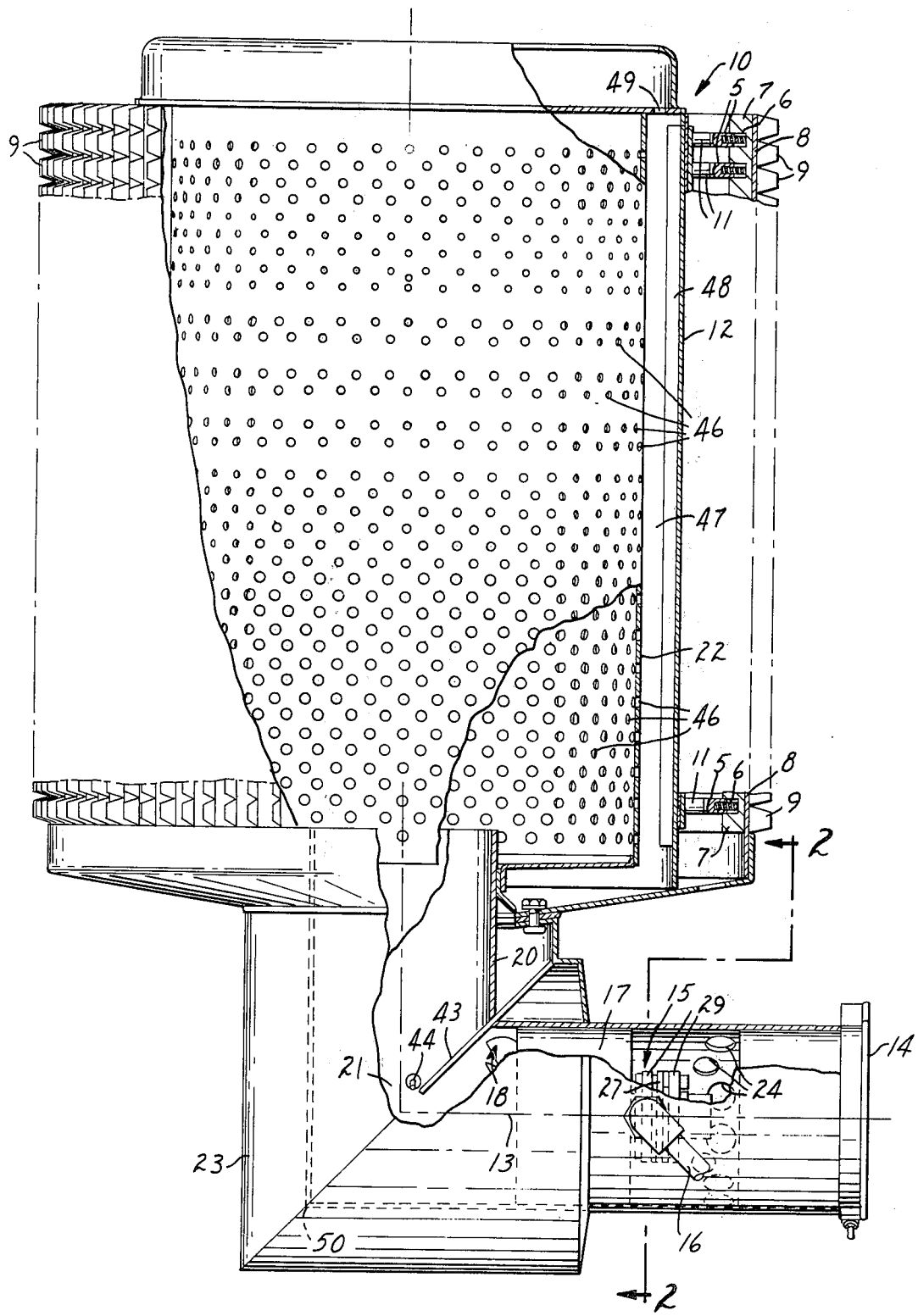
FIG. 1 is a side elevation view of a thermoelectric generator of the invention, with parts broken away.
Figure 2:
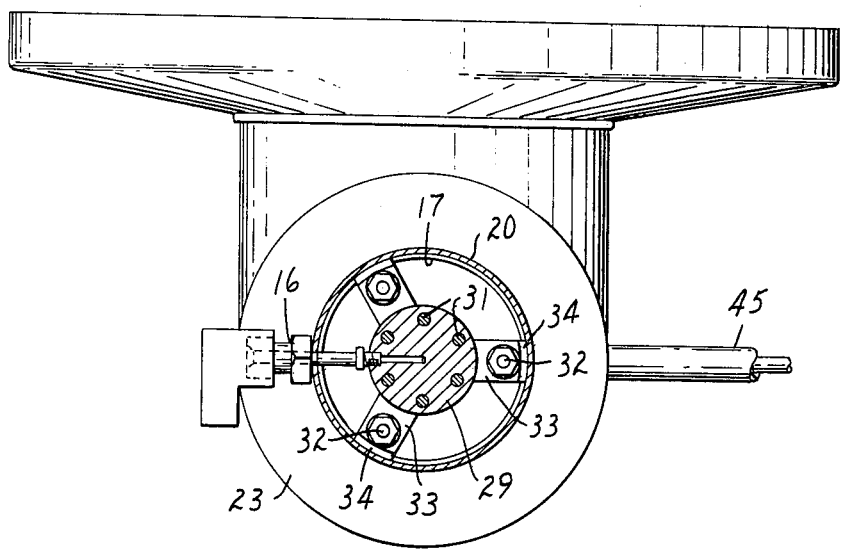
FIG. 2 is a section along the lines 2—2 of FIG. 1.
Figure 3:
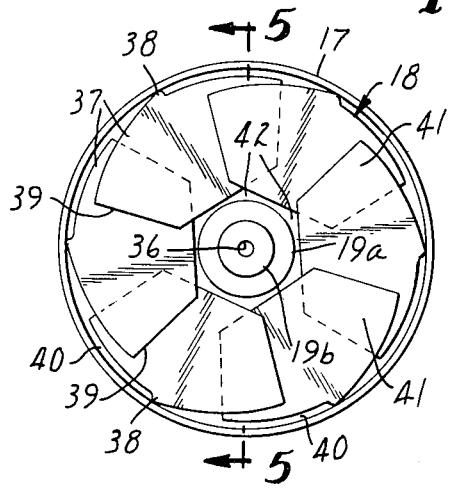
FIG. 3 is an end view of components from the thermoelectric generator of FIG. 1, including a baffle means and ultrasonic atomizer mounted inside a cylindrical wall.
Figure 5:
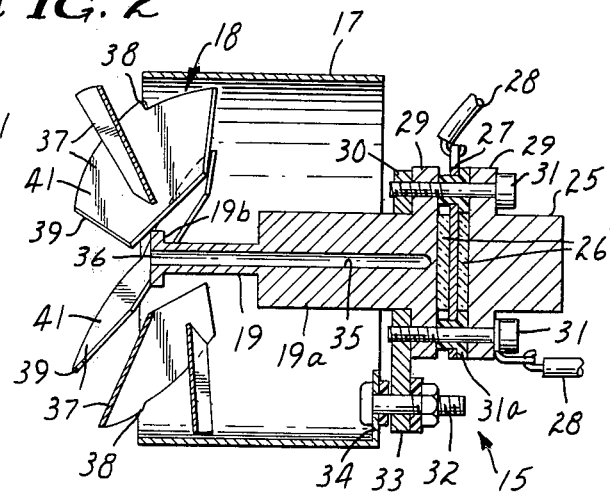
FIG. 5 is a sectional view of the baffle means, ultrasonic atomizer, and cylindrical wall of the thermoelectric generator of FIG. 1, taken along the lines 5—5 of FIG. 3.

A typical thermoelectric generator 10 of the invention is shown in FIGS. 1–5. This generator comprises an array of thermoelectric legs 11 (only three representative legs are shown in FIG. 1) disposed regularly around a cylindrical hot plate 12 and arranged in heat-conductive relation with the hot plate (the legs 11 are pressed by spring-biased followers 5 that slide in bores 6 in a cold plate 7, and the cold plate 7 is surrounded by a cold shell 8, to which heat-dissipating fins 9 are attached; the hot plate in a thermoelectric generator of the invention could, in less preferred embodiments, be flat, and "cylindrical" hot plates may have a cross-sectional shape other than a true cylinder, even being square in some cases).

Heat is supplied to the inside of the cylindrical hot plate 12 with a burner means of the invention that comprises, in alignment on a central axis 13, a blower means 14; an ultrasonic atomizer 15 connected by tube means 16 to a source of fuel; a cylindrical wall 17 spaced radially around the atomizer; baffle means 18 disposed around the tip of a horn 19 of the ultrasonic atomizer 15; a cylindrical burner housing 20 which receives the blower means 14, atomizer 15, cylindrical wall 17 and baffle means 18 and which extends beyond the cylindrical wall 17 in a right-angle extension to form a combustion chamber 21; and a cylindrical mantle 22 connected to said burner housing. An insulating jacket 23 surrounds the burner housing 20 and is filled with a generally fibrous thermal insulation. Openings 24 are provided in the housing 20 in this embodiment to reduce impedance to the flow of air caused by the blower means 14.

Ultrasonic atomizers have been described in several patents including U.S. Pat. Nos. 3,275,059 and 3,214,101. As shown best in FIGS. 2–5, a typical atomizer useful in the invention comprises a stepped horn 19 that will vibrate at an ultrasonic frequency and that includes a base portion 19a and a tip portion 19b, a dummy horn 25 to balance the vibrating horn, two piezoelectric crystals 26 between the vibrating horn and dummy horn, an electrode 27 positioned between the piezoelectric crystals and connected through leads 28 to an ultrasonic-frequency electric power source, and flanges 29 on the vibrating and dummy horns by which the atomizer parts are clamped together and to a mounting bracket 30 with screws 31. Plastic sleeves 31a around the screws 31 extend between the flanges 29 and through the electrode 27.

The atomizer 15 is attached to the cylindrical wall 17 by screws 32 which extend through arms 33 of the mounting bracket and through tabs 34 extending inwardly from the cylindrical wall. A fuel passage 35 runs from the tube means 16 through the vibrating horn 19 to an outlet 36 in the center of the end of the tip portion 19b of the horn. Fuel fed through the passage 35 forms as a thin film on the end of the vibrating horn and then is vibrated off the horn as a mist of fine particles or droplets.

Figure 4:
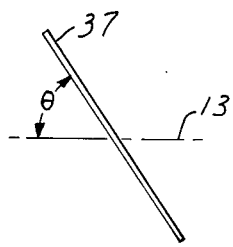
FIG. 4 is a schematic view of a vane of the baffle means of the thermoelectric generator shown in FIG. 1, shown with respect to a longitudinal axis through the generator.

The baffle means 18 of the thermoelectric generator of the invention illustrated in the drawings consists of vanes 37 fastened (as by welding) at a point 38 on their outer edge to the inside of the cylindrical wall 17 and positioned at an angle to the axis 13 (that is, the angle $\theta$ shown in FIG. 4). The forward edge 39 of the vanes 37 terminates in a plane that extends approximately through the longitudinal axis 13. Over most of their outer edge, the vanes 37 are spaced from the inside of cylindrical wall 17 to form a space 40. And the downstream portions 41 of the vanes 37 are gradually curved inwardly, which increases the distance of those portions of the vanes from the inside of the cylindrical wall 17. The innermost edge of the vanes is spaced from the horn to form a central space 42 around the horn.

Oxidizing gas (generally air) passing through the baffle means 18 and atomized fuel from the atomizer 15 mix and pass into the combustion chamber 21 formed by the burner housing 20. Ignition means are provided inside the combustion chamber by two wires 43 and 44 of a high-temperature-resistant alloy separated narrowly at their ends to form a sparking gap. The wire 43 is connected to the outer insulating jacket 23, which in turn is connected to ground through a grounding lug not shown, while the wire 44 is insulated from the housing 20, jacket 23, and other structure and is connected to a source of electric voltage through an insulated lead 45 (see FIG. 2).

In the illustrated thermoelectric generator, the burner housing 20 is formed with a right angle so that the burning and heated fuel and oxidizing gas mixture moves upwardly into the mantle. In other embodiments, which are generally preferred for efficiency of burning, the blower means 14, ultrasonic atomizer 15, burner housing 20 and mantle 22 are arranged on a straight longitudinal axis (note that for purposes herein the blower means, ultrasonic atomizer, burner housing, and mantle are all regarded as being on the same longitudinal axis 13, though that axis is bent at a right angle).

As previously noted, the baffle means 18 shapes oxidizing gas blown past the horn of the atomizer by the blower means 14 into three components: a component deflected by the vanes 37 into a swirl or vortex pattern; a center stream passing through the space 42 between the vanes 37; and an outside annular component passing along the inside of the cylindrical wall 17 through the space 40 between the outer edge of the vanes and the inside of the cylindrical wall 17. Each of these components has an important function. Because of the low pressure caused by the swirling movement within the vortex component, the mist of atomized fuel is rapidly drawn into the stream of oxidizing gas. Also, the low pressure of the vortex component causes the flame to remain closely spaced from the horn. Even if the flame is extinguished because of an air bubble in the fuel supply, the heat of the system will quickly reignite fuel just off the end of the horn. And burning generally can be initiated with fuel and air flowing at their maximum rate, which makes electronic control apparatus in the generator less costly and complex.

The center component moving through the space 42 between the vanes 37 keeps the flame away from the atomizer horn 19, and cools the horn. The outside annular component traveling through the space 40 provides an outer envelope that tends to confine the vortex component. It has been found that if the vortex component spreads outwardly too much, fuel is deposited on the sides of the burner housing, resulting in carbon accumulation and reducing the efficiency and the uniformity of the heating operation. In general, baffle configurations that provide for movement of oxidizing gas having the described three components are useful in the invention.

To develop a vortex component of sufficient magnitude to achieve a desired mixing of oxidizing gas and fuel, there are preferably five or more vanes in the baffle means. Also, the angle $\theta$ between the vanes and the axis 13 is generally more than about 20°, and preferably is more than about 40°. On the other hand, the angle $\theta$ is generally less than about 70°, and preferably is less than about 60°, so as to avoid formation of "dead" spaces (areas in which the air is not moving), to minimize impedance for the blower means, to cause a desired amount of oxidizing gas to enter the vortex, and to keep the flame spaced from the tip of the atomizer horn. The vanes overlap sufficiently so that a summation of the surface areas on one side of the vanes is at least 1.2 times, and preferably at least 1.6 times, as great as the area subtended by the vanes (that is, the area on a plane perpendicular to the central axis of the baffle means that would be covered if the vanes were projected onto the plane).

As the heated gases of the combustion process pass into the mantle 22 from the combustion chamber 21 inside the burner housing 20, there is a pressure drop, because the cross-sectional area of the mantle is greater than the cross-sectional area of the housing 20 (in this embodiment by about 600 percent); and this pressure drop draws the heated gases into the mantle. It is desirable for almost all burning to occur before the mixture of fuel and oxidizing gas leaves the housing 20, though the flame will often extend into the mantle. Because the burning is in large part completed within the housing 20, the distribution of heat throughout the mantle 22 is subject to more control.

Once in the mantle, the heated gases travel through openings 46 in the mantle, then upwardly through the space 47 between the mantle and the hot plate, which is preferably divided into longitudinally extending passageways by heat-collecting fins 48, and then out through openings 49 in the top of the mantle. The center portion of the top end of the mantle in FIG. 1 is closed so as to force the gases out through the openings 46. The hot plate 12 is heated both by convection of the heated gases in the space 47 and also by radiation from the heated mantle. The openings 46 in the mantle are arranged in a pattern that is empirically determined to cause heating of the hot plate 12 uniformly over its surface, and thus will provide a more uniform, efficient operation of the thermoelectric legs. In the illustrated embodiment, there is a greater open area (because of more and/or larger openings 46) at the two axial ends of the mantle than there is in the area between those two end portions, with the largest open area being at the downstream end of the mantle.

As a specific example of a thermoelectric generator of the invention, one illustrative thermoelectric generator was made in the arrangement shown in the drawing with parts of the following description: The blower means 14 comprised a vane-axial-type fan, capable of blowing about 10 cubic feet of air per minute at a pressure drop of 0.55 inch of water column. The inside diameter of the cylindrical wall 17 was 1.95 inches. There were six vanes 37 in the baffle means 18, disposed at an angle of 52° to the longitudinal axis 13 of the baffle means, and occupying about 1.8 times the area subtended by the vanes. Of the total cross-sectional area inside the cylindrical wall 17, 2.5 percent was occupied by the diameter of the tip 19b of the vibrating horn of the atomizer, about 5 percent was occupied by the space 42 between the tip of the horn and the inside edge of the vanes 37, about 70 percent was occupied by the vanes, and about 22 percent was occupied by the space 40 between the outer edge of the vanes and the inside of the cylindrical wall. The ultrasonic atomizer 15 was a full-wave, resonant, stepped-horn ultrasonic atomizer, vibrating at about 77 kilohertz. The burner housing 20 had a height from the point 50 in FIG. 1 of 4 inches and an inside diameter of 2 inches. The mantle 22 had an inside diameter of 5.25 inches and a length of 8.5 inches; and the cylindrical hot plate 12 had an inside diameter of 6 inches. Five-hundred-twelve thermoelectric legs were disposed around the hot plate 12, and the hot end of the legs was generally heated during operation of the generator to a temperature of 1050°F, with a variation between hot ends of less than 50°F.

What is claimed is:

1. Burner means for achieving high-efficiency burning of liquid fuels comprising, in alignment on a central axis, (A) blower means arranged to blow an oxidizing gas along said axis; (B) an ultrasonic atomizer downstream from the blower means, connected to a source of liquid fuel, and having a vibrating horn located on said axis from which the fuel emanates downstream as a fine mist, (C) a cylindrical wall spaced radially around said horn and in line with said blower means so as to convey said oxidizing gas downstream from said blower means past said horn; and (D) baffle means disposed around said horn and consisting essentially of a set of overlapping vanes that are attached to the inside of said wall, extend radially toward said axis, and are disposed at an angle to said axis so as to form a first part of the oxidizing gas that is conveyed downstream by the cylindrical wall into a vortex; the innermost edge of the vanes being adjacent to, but spaced from, said horn so as to define an area through which a second part of said oxidizing gas passes unimpeded; and at least part of the outermost edge of the vanes being spaced from the cylindrical wall so as to permit a third part of said oxidizing gas to pass unimpeded along the wall so as to contain said vortex into a compact area, whereby the flame of fuel supplied by said ultrasonic atomizer is kept compact.

2. Burner means of claim 1 in which the vanes are disposed at an angle of between about 20° and 70° to said axis.

3. Burner means of claim 1 in which the vanes are disposed at an angle of between about 40° and 60° to said axis.

4. Burner means of claim 1 in which the total surface area on one side of the vanes is 1.6 times as great as the area subtended by the vanes.

5. Burner means of claim 1 in which part of the downstream edge of the vanes curves inwardly toward said axis from the point of connection of the vanes to the cylindrical wall.

6. Burner means for achieving high-efficiency burning of liquid fuels comprising, in alignment on a central axis, (A) blower means arranged to blow an oxidizing gas along said axis; (B) an ultrasonic atomizer downstream from the blower means, connected to a source of liquid fuel, and having a vibrating horn located on said axis from which the fuel emanates downstream as a fine mist; (C) a cylindrical wall spaced radially around said horn and in line with said blower means so as to convey said oxidizing gas downstream from said blower means past said horn; and (D) baffle means disposed around said horn and consisting essentially of a set of overlapping vanes that are attached to the inside of said wall, extend radially toward said axis, have a total surface area on one side equal to at least about 1.6 times the area subtended by the vanes, and are disposed at an angle of between about 20° and 70° to said axis so as to form a first part of the oxidizing gas that is conveyed downstream by the cylindrical wall into a vortex; the innermost edge of the vanes being adjacent to, but spaced from, said horn so as to define an area through which a second part of said oxidizing gas passes unimpeded; and at least part of the outermost edge of the vanes being spaced from the cylindrical wall so as to permit a third part of said oxidizing gas to pass unimpeded along the wall so as to contain said vortex into a compact area, whereby the flame of fuel supplied by said ultrasonic atomizer is kept compact.

7. Burner means of claim 6 in which the vanes are disposed at an angle between about 40° and 60° to said axis.

8. Burner means of claim 6 in which part of the downstream edge of the vanes curves inwardly toward said axis from the point of connection of the vanes to the cylindrical wall.

* * * * *